United States Patent [19]

Oh

[11] Patent Number: 4,549,914
[45] Date of Patent: Oct. 29, 1985

[54] INTEGRATED CIRCUIT CONTACT TECHNIQUE

[75] Inventor: Kye H. Oh, Allentown, Pa.

[73] Assignee: AT&T Bell Laboratories, Murray Hill, N.J.

[21] Appl. No.: 597,924

[22] Filed: Apr. 9, 1984

[51] Int. Cl.⁴ .......................................... H01L 21/225
[52] U.S. Cl. .................................... 148/187; 148/188; 148/191; 29/571; 29/576 B; 29/578; 29/580; 29/591
[58] Field of Search ........................ 148/187, 188, 191; 29/571, 576 B, 578, 580, 591

[56] References Cited

U.S. PATENT DOCUMENTS

| | | | |
|---|---|---|---|
| 3,600,651 | 8/1971 | Duncan | 148/188 X |
| 3,607,466 | 9/1971 | Miyazaki | 148/191 X |
| 4,104,086 | 8/1978 | Bondur et al. | 148/1.5 |
| 4,291,322 | 9/1981 | Clemens et al. | 357/23 |
| 4,353,086 | 10/1982 | Jaccodine et al. | 357/51 |
| 4,431,460 | 2/1984 | Barson et al. | 148/1.5 |
| 4,445,266 | 5/1984 | Mai et al. | 29/571 |
| 4,450,620 | 5/1984 | Fuls et al. | 29/571 |

Primary Examiner—George T. Ozaki
Attorney, Agent, or Firm—Peter V. D. Wilde

[57] ABSTRACT

A transfer layer is utilized to laterally redistribute impurities from a more heavily doped region to a lighter doped region. The contact to the source-drain region in advanced memory arrays has a width of the order of the minimum feature size. The source-drain has similar minimum feature dimensions in width to keep the array optimally dense. Thus this contact is made "headless" and requires a "line on line" alignment. Some offset in forming the window is inevitable and that offset exposes the channel stop. The contact then shorts to the substrate.

Using a polysilicon transfer layer with an appropriate post anneal the region immediately under the contact and along the window sidewall can be autodoped sufficiently to avoid shorts to the substrate, and provide a continuous electrical path for the deposited contact.

7 Claims, 14 Drawing Figures

INTEGRATED CIRCUIT CONTACT TECHNIQUE

BACKGROUND OF THE INVENTION

As the size of active impurity regions in semiconductor integrated circuit substrates shrink the size of the electrical contacts to those regions likewise shrink. A limiting factor is the minimum line that can be produced in a given technology. When the impurity region is reduced to that minimum dimension the contact "window" that is made prior to forming the contact cannot, as is customary, be made smaller than the region to be contacted. As a result both features are made with the minimum feature size and the contact will almost certainly be partially non-aligned or offset with the region to be contacted. This situation is commonly referred to as "line-on-line" features, i.e. features that require minimum line on minimum line registration. Whether the alignment is visual or automatic it is not possible to make precise line on line features.

This difficulty can be overcome by implanting an appropriate impurity into the contact window prior to forming the contact. This produces a self-aligned contact with the region to be contacted.

As useful as this tool evidently is, it suffers when applied to CMOS technology. In that case two implants and additional masks are required because p-type impurities are required for the p-channel device windows and n-type impurities for the n-channel device windows.

STATEMENT OF THE INVENTION

The technique described here is directed primarily at forming line-on-line contacts in CMOS devices. However, an understanding of the operation and advantages of the technique makes evident its usefulness in non-complementary device processes as well.

A primary feature of the invention is the use of a contact layer as a transfer layer to redistribute impurities laterally from a relatively heavily doped region of one conductivity type to a lighter doped region of the other type and create from those regions of opposite conductivity type a single region of the desired conductivity type. That single region is then self aligned with the transfer layer.

In a typical integrated circuit, e.g. source-drain contact, the consequence of this unavoidable misalignment is a short. In the case of the source-drain contacts to MOS transistors the contact is shorted to the substrate, i.e. $V_{DD}$ to $V_{SS}$.

A relatively straightforward solution to this problem is to implant sufficient impurities into the open contact window to insure that the contact region is continuous and of a single conductivity type. For NMOS arrays this would involve an implant of n-type impurities at a dose sufficient to convert the exposed boron-doped channel stop to n-type.

However there are situations where that implant is not desired, e.g. because it involves an added step, or where, as in CMOS processing, it cannot be done without extra masking, i.e. several added steps.

BRIEF STATEMENT OF THE INVENTION

I have demonstrated a technique for localized doping of shorting regions exposed in contact windows without the addition of further impurities and without the need for added processing steps. It uses an impurity transfer layer to transport impurities from the impurity region being contacted to the exposed region of the opposite type and convert that region to the desired conductivity type. The only constraint on the effectiveness of this technique is that the doping level of the region being contacted is higher than that of the exposed region of the opposite type. The transfer layer comprises a material in which the impurities diffuse rapidly. The preferred transfer layer is polysilicon or amorphous silicon, or a silicon-rich material such as a refractory metal silicide, e.g. $TiSi_2$, $TaSi_2$ or $CoSi_2$. An advantage of using silicon rich materials as the transfer layer is that they can be left in place, after serving to redistribute the impurities, to form part of the contact structure. This process is compatible, therefore, with the so-called "poly-plug" contact technique described and claimed in U.S. Pat. No. 4,291,322.

DETAILED DESCRIPTION

The invention will be described in terms of a specific application, namely for source and drain contacts in CMOS devices. It will be appreciated that CMOS technology, with the ever present complementary pairs of devices, presents special processing problems and this invention aptly addresses some of them. However it should also be evident that the technique is advantageous in other technologies, e.g. source-drain contacts in NMOS device processing, emitter contacts in bipolar device processing, or for forming ohmic contacts to silicon, III–V or II–VI semiconductor bodies. Applications may be found in stripe geometry lasers, photodiodes or diode array devices like the silicon vidicon.

Figure 1:
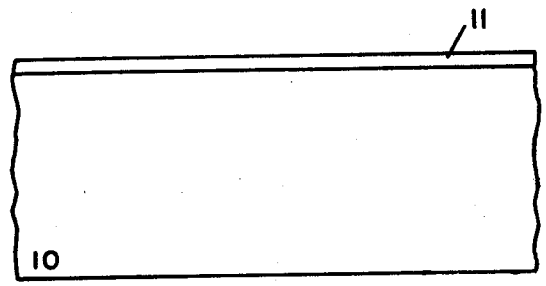
FIGS. 1 to 14 describe schematically a typical processing sequence in accordance with the invention.
Figure 2:
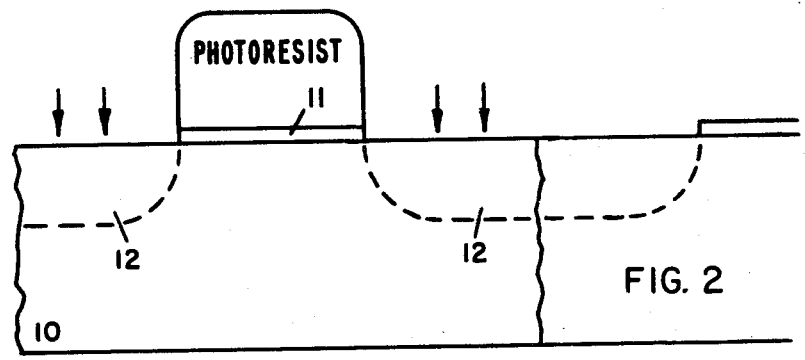
Figure 3:
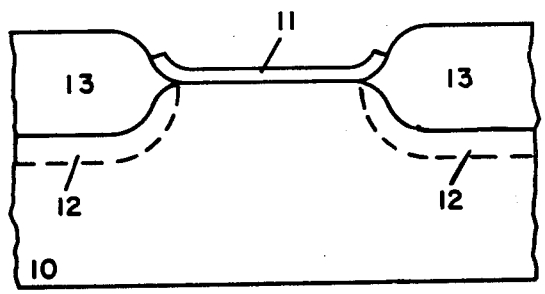
Figure 4:
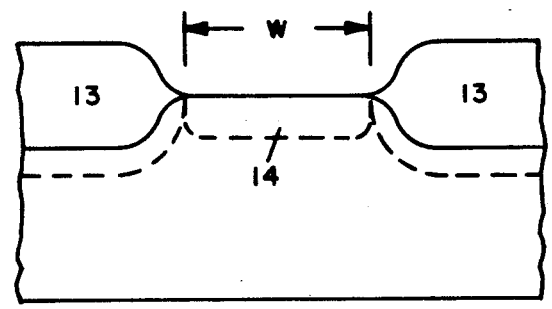

Referring to FIG. 1, a silicon substrate 10 with a p-type epitaxial layer doped to $2 \times 10^{15}/cm^3$ shown covered with the conventional 175Å $SiO_2$ and 1200Å $Si_3N_4$ composite masking layer 11. As shown in FIG. 2, the masking layer 11 is patterned and the boron channel stop 12 is implanted, e.g. $6 \times 10^{12}/cm^2$ at 200 kev. Mask layer 11 defines the active region for transistors, resistors and capacitors as well as the contact region to the substrate 10. The size of the contact is optimally small, preferably headless and line on line, to maximize the device packing density. After the photoresist in FIG. 2 is stripped field oxide 13, e.g. $0.7\mu$, is grown as shown in FIG. 3. The mask layer 11 is stripped (FIG. 4). The transistor gate is formed (not shown in FIG. 4) and self-aligned source-drain window is implanted with, e.g. arsenic at 50 kev and $1 \times 10^{16}/cm^2$ dose to form N+ contact region 14 of concentration $1.5 \times 10^{21}/cm^3$. If mask layer 11 is optimally small, contact region 14 is even smaller due to the lateral growth or "birds beak" of layer 13. This region has a width designated "W" in FIG. 4.

An oxide layer, 15, e.g. 1000Å in thickness is then grown over the silicon exposed in the window and a phosphosilicate glass (PSG) or borophosphosilicate glass (BPSG) layer 16 is deposited thereover. The PSG or BPSG layer is typically of the order of 1 micron and serves the well known gettering function. Layer 15 serves as a buffer layer separating the phosphorus and boron in layer 16 from the active substrate region.

Contact window 17 is then cut in layers 15 and 16 down to contact region 14. Because width "W" (FIG. 4) of the contact region is optimally small, in terms of the lithographic capability of the technology used, it is not possible to make the width W' (FIG. 6) of this contact window relatively smaller by a significant margin, than width W (as is customarily done in a contact with a head to insure that the contact remains well within the region to be contacted even accounting for misalignment tolerances). For the purposes of this invention we define line-on-line as approximately W' greater than W or at least W'>0.75 W. In either case the result shown in FIG. 6, i.e. the p+ channel stop exposed in the contact window, will be unavoidable.

Figure 6:
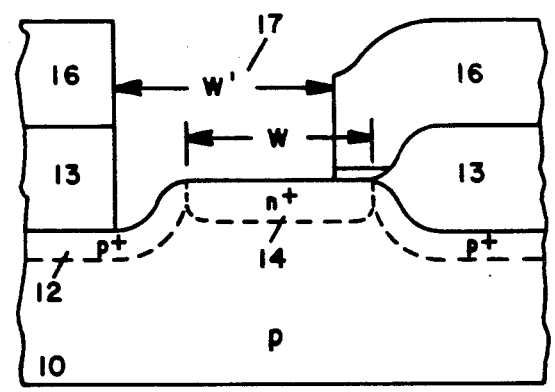

As suggested earlier the structure shown in FIG. 6 can be implanted with arsenic to convert the exposed p+ channel stop to n-type thus eliminating the potential short when the contact is formed in window 17. However it will be appreciated that at this stage of a CMOS process there are p-contacts as well as n-contacts exposed so a blanket implant would be ineffective. In NMOS or PMOS processing, this situation may not arise but even here the implant step just described may be dispensed with using the following steps.

Figure 7:
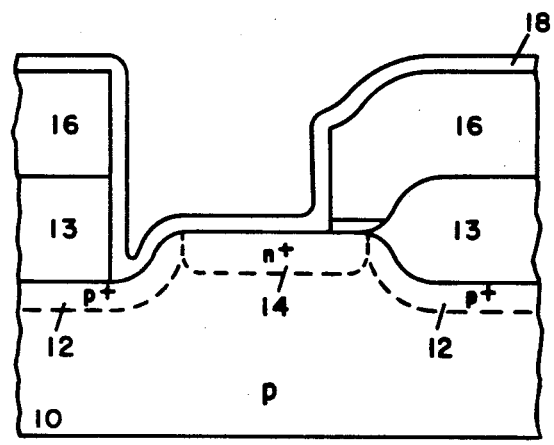
Figure 8:
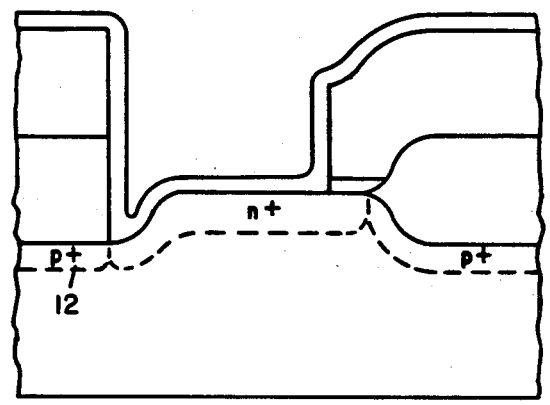

As shown in FIG. 7, a polysilicon or amorphous silicon layer 18 is non-selectively deposited over the contact window. This layer, typically of the order of $0.2\mu$, serves as the transfer layer and is undoped. It will be appreciated that this layer can in some applications be doped heavily n-type and thus serve as a primary source of impurities to compensation dope the exposed p+ channel stop 12. However, as can be inferred from the earlier discussion such an approach in CMOS processing is not straightforward. Therefore, according to one aspect of this invention layer 18 is deposited essentially undoped. The preferred method of deposition is CVD, to aid in sidewall coverage. However it will be appreciated that the function of the transfer layer, as seen best in FIG. 8, is to channel impurities laterally above the surface of the exposed substrate. To achieve that it is not necessary to have optimum sidewall coverage. Sidewall coverage is desirable when the technique of this invention is used in conjunction with the so-called "poly plug" process alluded to earlier.

Using the conventional metal (aluminum) metallization process the PSG layer would normally be heated to cause flow and rounding of the window corners for the metal to cover properly. However, using the technique described here this step is unnecessary. The polysilicon layer serves to complete otherwise incomplete electrical paths along the sidewalls. It will be appreciated that this feature resembles the so-called "poly plug" process but with the significant difference that the polysilicon layer may be utilized in an undoped condition. This difference is important in CMOS processing in which p+ contact regions as well as n+ regions as shown here present the same or similar considerations. Both types of contacts can be treated the same way using the techniques described here.

With layer 18 in place the assembly is heated to promote diffusion of n-type impurities through the transfer layer into the p-region 12 so as to convert that region to n-type and eliminate the potential short to the substrate. Recommended conditions for this treatment are 950° C. for 60-90 minutes.

Those skilled in the art will recognize that diffusion of p-type impurities in the opposite direction will also occur. This is why n-region 14 should be more heavily doped than p-region 12. It is expected that this process will be effective if that difference is greater than 10.

Also evident to those skilled in the art is that impurities will diffuse in both directions within substrate 10. To be effective therefore the transfer layer 18 should comprise a material in which the diffusion rate of impurities is significantly greater e.g. twice, the diffusion rate in the substrate material.

Figure 5:
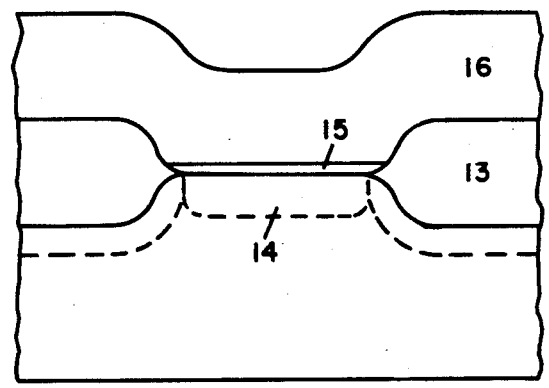
Figure 9:
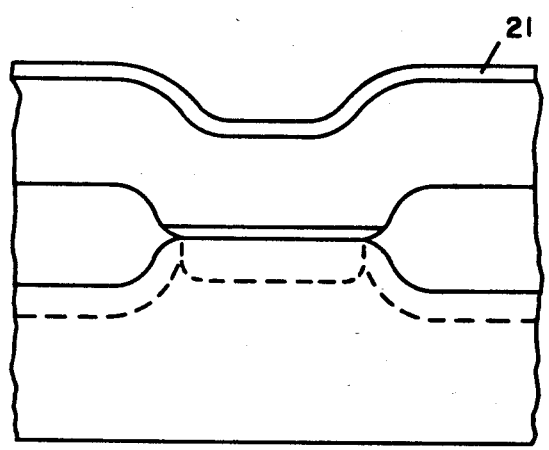
Figure 10:
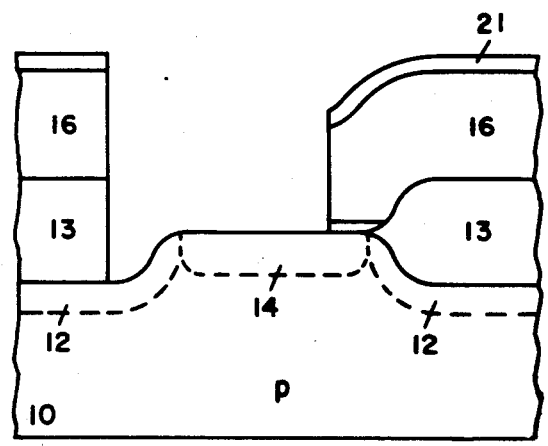
Figure 11:
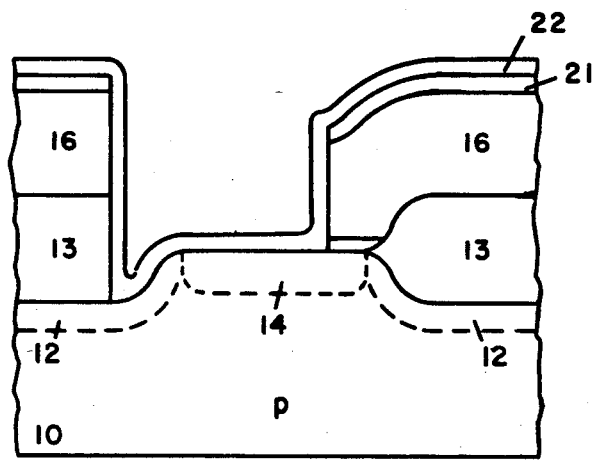

In applications directed toward CMOS devices the impurities in glass layer 16, e.g. phosphorus, boron, may themselves diffuse within transfer layer 18 to the contact region. That can be avoided if layer 18 is deposited, as by evaporation or sputtering, in a directional mode so that the sidewalls are not coated or are incompletely coated in case of the non poly-plug type contact. Another approach to preventing outdiffusion and unwanted migration of impurities from the doped glass layer 16 as in the poly-plug type contacts is to cap it with deposited undoped oxide before the deposition of polysilicon layer 18. A suitable processing sequence for capping layer 16 is shown in FIGS. 9-14. FIG. 9 is a stage in the overall process sequence that corresponds to FIG. 5. Steps represented by FIGS. 1-4 would be repeated to reach this stage. Reference numbers 10-17 in FIGS. 9-14 denote essentially the same structural features as were described in connection with FIGS. 1-8.

Figure 12:
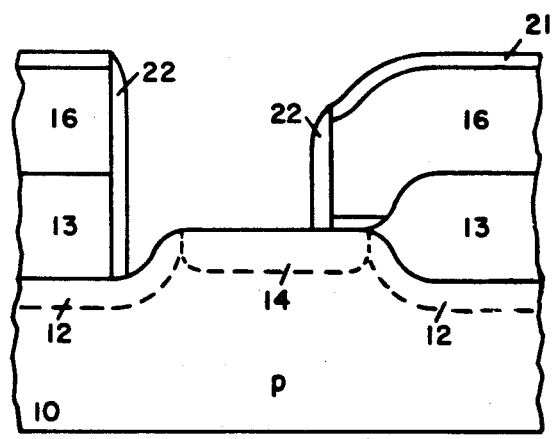

FIG. 9 shows an additional layer 21 which is of undoped oxide for example and is of the order of $0.2\mu$ thick. The contact window is opened as before, FIG. 10, and the sidewall capping layer 22, again typically undoped $SiO_2$, is deposited preferably by CVD to cover the sidewalls as shown. Next, layer 22 is etched anisotropically to remove the bottom portion of the layer at which time the portion of layer 22 along the top surface is also removed. However as is known due to the anisotropic nature of the etch process the portion of layer 22 along the sidewalls is incompletely etched and a sufficient thickness of layer 22 to serve as a cap for the sidewall of doped layer 16 remains as shown in FIG. 12. Suitable anisotropic etch techniques are known. See e.g. U.S. Pat. No. 4,104,086 issued Aug. 1, 1978.

Figure 13:
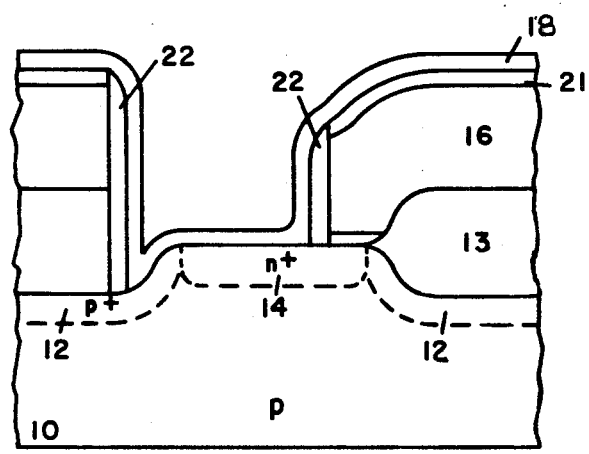
Figure 14:
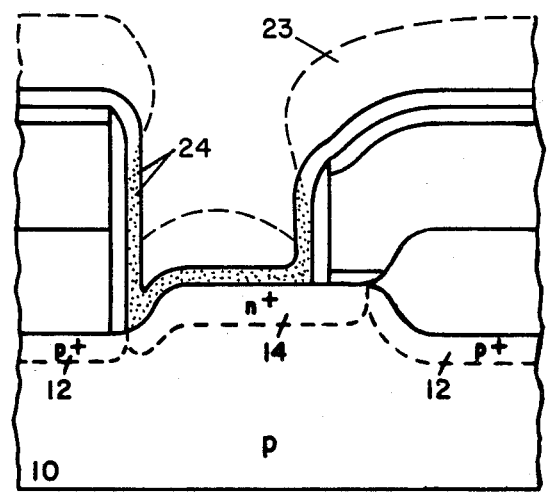

With the capping layer 21, 22 in place processing proceeds as before, i.e. FIGS. 13 and 14 correspond to the steps described in conjunction with FIGS. 7 and 8.

FIG. 14 shows a metal layer 23, e.g. aluminum, deposited in a conventional manner, and shows incomplete sidewall coverage, a common problem. Using the transfer layer according to this invention gaps in the sidewall metal coverage are filled, in an electrical sense, by the transfer layer. The sidewall portions of the transfer layer are doped with impurities 24 from the contact region 14. Consequently, the process is fully CMOS compatible.

Although the invention has been described herein in terms of a technique for overcoming source-substrate shorts in memory and related devices it will be understood by those skilled in the art as having other applications. The basic contribution is a technique for selective doping of one region in a semiconductor body with impurities obtained from another region of that semiconductor with the aid of a transfer layer external to the substrate. The regions may have the same or opposite conductivity types. Significant transfer requires that one region be substantially more heavily doped than the other, as prescribed earlier. The impurity source region and the impurity receiving region may be adjacent, i.e. not touching, or may be contiguous, i.e. touching. The transfer of impurities will ordinarily be effected by thermal means. It is sufficient to heat the transfer layer or the substrate. In most cases, both will be heated. Heating means may be a furnace, laser, electron beam, or equivalent.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Method comprising:
   forming a first impurity region in a single crystal semiconductor substrate, said substrate having a second impurity region contiguous to the first,
   forming a transfer layer of polysilicon overlying the substrate and, in contact with both said first and second regions,
   and heating said transfer layer at a temperature and for a time sufficient to cause significant transfer of impurities from said first region to said second region.

2. Method comprising:
   forming a first region of a first conductivity type in a semiconductor substrate, said first region having contiguous thereto a second region said second region having the opposite conductivity type and a doping level substantially less than the doping level of the first region,
   forming a transfer layer of polysilicon over said substrate in contact with both first and second regions,
   and heating said substrate to a temperature and for a time sufficient to cause diffusion of impurities through said transfer layer from said first region to said second region and conversion of said second region to the first conductivity type.

3. Method comprising:
   forming a heavily doped region of one conductivity type in a semiconductor substrate said region extending into the surface of the substrate and having at least one adjacent surface region of the opposite conductivity type, said heavily doped region having an impurity level substantially higher than that of the adjacent region, said heavily doped region having a width W at the surface of the substrate,
   forming a dielectric layer over the substrate,
   masking the dielectric layer with a mask having an opening W' with a width of the order of 0.75 W, said opening being predominantly in vertical registration with said heavily doped region but offset so as to overlie part of said adjacent surface region,
   selectively etching substantially through said dielectric layer using said mask to form a window in the dielectric layer,
   depositing a contact layer comprising amorphous silicon or polysilicon into said window to form a contact to said heavily doped region and said part of the adjacent surface region,
   and heating the polysilicon contact layer at a temperature and for a time sufficient to cause impurities from said heavily doped region to diffuse through the polysilicon contact layer into said adjacent region and convert said adjacent region to the same conductivity type as the heavily doped region.

4. Method for forming complementary devices comprising;
   forming an insulating layer over a semiconductor substrate,
   forming at least two openings in said insulating layer,
   forming an impurity region of a first conductivity type in a first of said openings and an impurity region of the opposite conductivity type in the other of said openings in a manner such that at least said first opening exposes a region of the second conductivity type as well as said region of the first conductivity type, said regions being contiguous,
   forming a polysilicon or amorphous silicon transfer layer covering said openings, including the sidewalls thereof, and covering at least a portion of each of said aforementioned impurity regions,
   heating the substrate and the transfer layer to diffuse impurities from one of said contiguous regions through said transfer layer to the other,
   and forming metal contacts in said openings.

5. Method according to claim 4 in which said heating step diffuses impurities into the portions of the transfer layer covering the sidewalls of the openings.

6. Method according to claim 4 in which said insulating layer includes a layer of doped glass.

7. Method according to claim 6 in which said doped glass layer is covered with a layer of undoped insulator.

* * * * *